United States Patent
Papaliolios

(10) Patent No.: US 6,259,286 B1
(45) Date of Patent: Jul. 10, 2001

(54) METHOD AND APPARATUS FOR A POWER-ON-RESET SYSTEM

(75) Inventor: Andreas Papaliolios, Sunnyvale, CA (US)

(73) Assignee: Triscend Corporation, Mountain View, CA (US)

(*) Notice: Subject to any disclaimer, the term of this patent is extended or adjusted under 35 U.S.C. 154(b) by 0 days.

(21) Appl. No.: 09/419,202

(22) Filed: Oct. 15, 1999

(51) Int. Cl.$^7$ .............................. H03K 3/01; H03K 17/22
(52) U.S. Cl. ............................ 327/143; 327/142; 327/198
(58) Field of Search ................................. 327/530, 142, 327/143, 198

(56) References Cited

U.S. PATENT DOCUMENTS 5,612,642 * 3/1997 McClintock ........................ 327/143
5,894,423 * 4/1999 Ling et al. ....................... 364/528.28

* cited by examiner

*Primary Examiner*—Dinh T. Le
(74) *Attorney, Agent, or Firm*—Blakely, Sokoloff, Taylor & Zafman LLP

(57) ABSTRACT

A method and apparatus for a power-on reset system is provided. The power-on reset system comprises a voltage sense circuit for determining whether a voltage level is above a threshold and a write/rewrite verifier circuit for determining whether the voltage level is high enough to write to and rewrite a memory cell content. A power-on reset pulse emitted by the power-on reset system if the voltage level is above the threshold and high enough to write to and rewrite the memory cell. For one embodiment, this is system generates an initial POR pulse upon power-up but can thereafter be selectively disabled and consume zero power.

20 Claims, 9 Drawing Sheets

METHOD AND APPARATUS FOR A POWER-ON-RESET SYSTEM

FIELD OF THE INVENTION

The present invention relates to a power-on-reset system, and more specifically, to a power-on reset system that may be powered off during a shutdown.

BACKGROUND

Power-on reset circuits are used to ensure that a circuit is connected to power only when the power is currently good and has been good for some time. Generally power-on-reset circuits must completely and quickly activate to reset the system upon any indication of poor power quality.

Generally, power-on-reset (POR) pulse generation circuits rely on one of three principles. The first principle is tracking of a process threshold voltage, such as a MOSFET Vt. When the voltage is above the threshold, the POR pulse is sent.

A second principle is sensing an absolute voltage level in comparison to a reference voltage. When the absolute voltage is above the reference voltage, the POR pulse is sent.

The third principle is delay. Once an acceptable voltage level is reached through one of the other methods, a staged R-C or clock/counter delay is generated to ensure that voltages have stabilized.

FIG. 1 illustrates one prior art power-on-reset circuit using these principles. This circuit 110 works, assuming that the $V_{cc}$ 140 voltage rises quickly and monotonically to its maximum value and stays there. Under those conditions, you can choose an RC time constant large enough to guarantee that the Schmitt-trigger gate 120 holds ~RESET 130 low (active) for any specified time after $V_{cc}$ 140 stabilizes. After the RC time-out, ~RESET goes high (inactive), commencing normal operations.

Conventional power-on reset circuits generally are left running when the circuits are powered down, to detect an external reset of power-up. This results in a less-than-perfect shutdown.

Therefore, an improved power-on reset system may be useful.

SUMMARY OF THE INVENTION

It is an object of this invention to provide a low power power-on reset system.

A method and apparatus for a power-on reset system is described. The power-on reset system comprises a voltage sense circuit for determining whether a voltage level is above a threshold and a write/rewrite verifier circuit for determining whether the voltage level is high enough to write to and rewrite a memory cell content. A power-on reset pulse emitted by the power-on reset system if the voltage level is above the threshold and high enough to write to and rewrite the memory cell. For one embodiment, this is system generates an initial POR pulse upon power-up but can thereafter be selectively disabled and consume zero power.

Other objects, features, and advantages of the present invention will be apparent from the accompanying drawings and from the detailed description that follows.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A power-on reset system is described. It is generally known that logic, such as CMOS logic, can function if its supply voltage exceeds the absolute value of the greater of the n-channel Vt and the p-channel Vt. A supply voltage over this minimum value adds margin and speed to the operation. Some circuits, such as pass-transistor logic and memory arrays exceed the simple needs of such CMOS logic. For this circuits the power-on reset system (POR) should inhibit operation until the initial supply voltage has risen enough to sustain such circuits. For one embodiment, CMOS SRAM-based programmable logic uses an additional n-channel Vt (Vtn) above the basic CMOS voltage level, and the capability to write and overwrite SRAM bits in an array. This voltage level may or may not be known.

For one embodiment, this voltage level is met by adding a Vtn to the minimum operation level and by adding SRAM cells, to verify that the voltage is sufficiently high to write and overwrite SRAM bits. For one embodiment, two SRAM cells with appropriate wiring circuits are added. For one embodiment, the wiring of the SRAM cells' writing circuits may be weakened to force worst-case operation.

Figure 1:
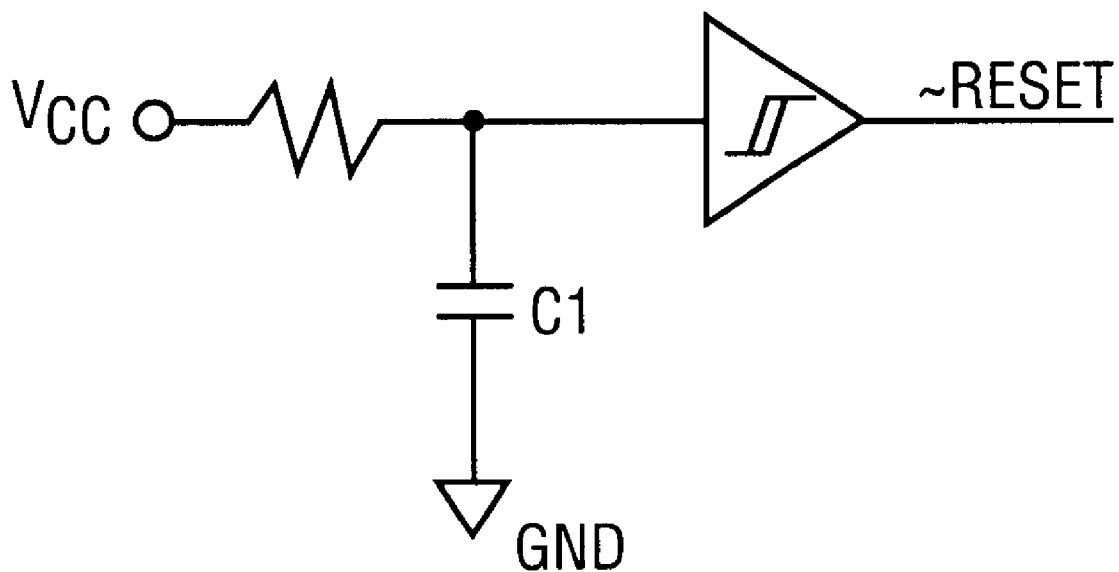
FIG. 1 is a circuit diagram of a prior art power-on reset circuit.
Figure 2:
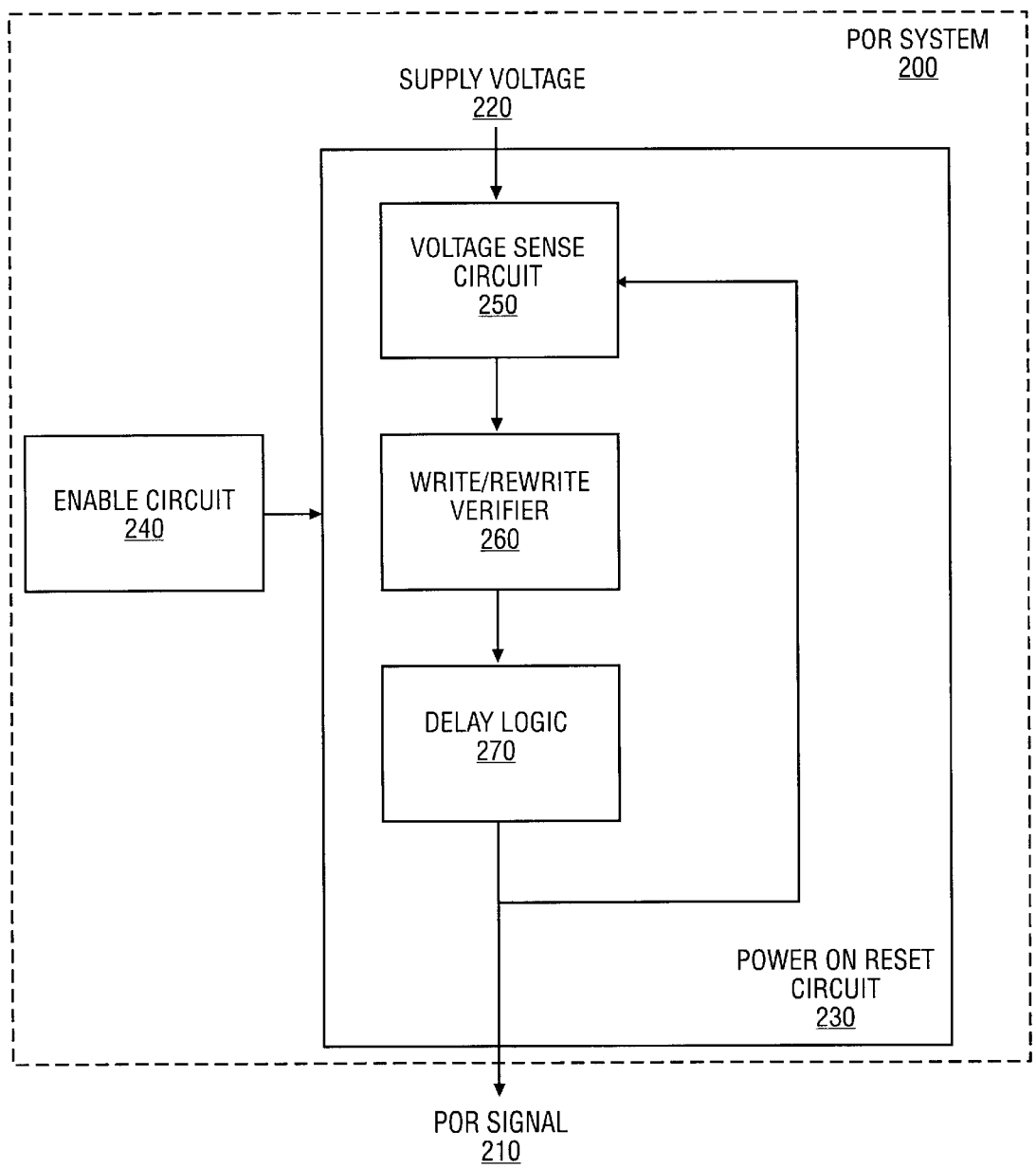
FIG. 2 is a block diagram of one embodiment of a power-on reset system according to the present invention.

FIG. 2 is a block diagram of one embodiment of a power-on reset (POR) system according to the present invention. The POR system 200 includes a voltage sense circuit 250. The voltage sense circuit 250 verifies that the voltage level in the system is above a certain threshold. For one embodiment, for CMOS logic, the threshold is set at $$2*|V_{tn}|+|V_{tp}|,$$

where Vtn is the n-channel Vt, threshold voltage, and Vtp is the p-channel Vt.

When the voltage sense circuit 250 determines that the voltage level is above the threshold, the voltage sense circuit 250 passes a signal to the write/rewriter verifier 260. The write/rewrite verifier 260 determines whether an SRAM cell can be written to 1 and rewritten to zero. For one embodiment, the write/rewrite verifier 260 includes two SRAM cells, one initialized to 1 and one initialized to zero, and the write/rewrite verifier 260 attempts to write a zero to the SRAM cell initialized to 1, and a 1 to the SRAM cell initialized to zero. Once the write/rewriter verifier 260 determines that both the write and rewrite were successful, a signal is passed to the delay logic 270.

The delay logic 270 inserts an additional small delay before the POR signal is altered. For one embodiment, the small delay ensures that chip-wide circuits have time to be reset. The delay logic 270 then deasserts the POR signal 210, to indicate the completion of the POR cycle. Until the delay logic 270 deasserts the POR signal 210, the POR signal is asserted, or in a "RESET stage" not permitting the circuits coupled to the POR system 200 to operate. When the POR signal 210 is deasserted, the circuits coupled to the POR signal 210 (not shown) are permitted to operate normally.

The voltage sense circuit 250 is further coupled to the POR signal 210. The voltage sense circuit 250 determines whether the POR signal needs to be reasserted, i.e. the circuit needs to be disconnected from power because the supply voltage level has dropped sufficiently. The triggering of the voltage sense circuit 250 re-initializes the sample SRAM cells in the write/rewrite verifier 260, so that the chip coupled to the POR system 200 can not become operational again, until the above described process has been completed.

Enable logic 240 permits the POR system 200 to be completely powered down, for zero power consumption. The enable logic 240, during the first moments of device power-up, asserts a signal that is maintained until the POR pulse signal 210 flips the signal, placing the POR system 200 under the control of the enable logic 240. In this way, the POR system 200 may be completely turned off while the circuit is in a power-down mode. For one embodiment, voltage sense circuit 250 consumes static power, unless the enable logic 240 powers it down. Thus, the enable logic 240 reduces static power consumption of the voltage sense circuit 250.

The POR system 200 protects circuits coupled to the POR system 200 from operating with too low a voltage. Specific embodiments of the circuits that may be part of the POR are described below.

Figure 3:
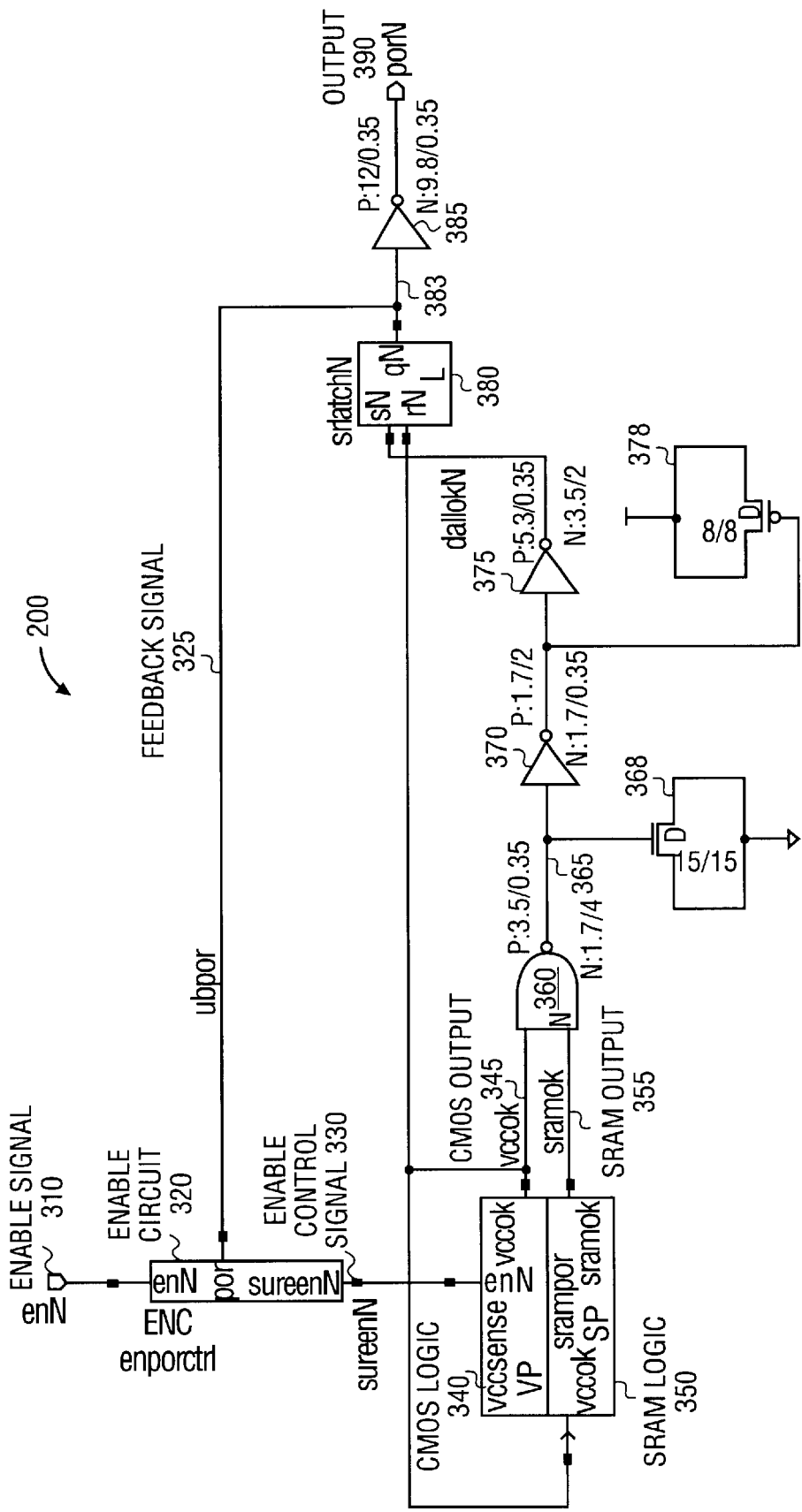
FIG. 3 is a circuit diagram of one embodiment of a power-on reset system.

FIG. 3 is a circuit diagram of one embodiment of a power-on reset system. The power-on reset system 200 includes the power-on reset circuit 230. An enable circuit 320 receives an enable signal 310, from outside the FOR system 200. For one embodiment, the enable signal 310 is a logic level Enable signal, designed to enable the circuitry to which the POR is coupled. The enable signal 310 is input to the enable circuit 320. The enable circuit 320 outputs an enable control signal 330, which is input to the CMOS logic 340. The output of the power-on reset system 200 is a feedback input to the enable circuit 320.

The CMOS logic 340 determines whether the supply voltage (not shown) is high enough to drive CMOS circuitry. The output of the CMOS logic 340 is the CMOS output 345. For one embodiment, the CMOS output signal 345 is a logic high signal. Thus the CMOS output signal 345 is high when the supply voltage is sufficiently high to drive CMOS circuitry.

SRAM logic 350 determines whether the supply voltage is sufficiently high to write and/or overwrite data in an SRAM cell. The CMOS output signal 345 is an input signal to the SRAM logic 350. The output of the SRAM logic 350 is SRAM output 355. For one embodiment, SRAM output signal 355 is an active high signal, which is high when the supply voltage is sufficiently high to write/overwrite SRAM data.

The outputs of CMOS logic 340 and SRAM logic 350, CMOS output signal 345 and SRAM output signal 355 respectively, are inputs to NAND gate 360. The output of NAND gate 360 is control signal 365. Control signal 365 is only high if both the CMOS output signal 345 and SRAM output signal 355 are high, i.e. if the supply voltage is high enough to both drive the CMOS circuits and write/rewrite the SRAMs.

The control signal 365 is input to a plurality of inverters 370, 375. A plurality of active capacitors 365, 378 are coupled between NAND gate 360 and inverters 370, 375. For one embodiment, active capacitor 365 is a source/drain coupled n-type metal oxide semiconductor (NMOS) while capacitor 378 is a source/drain coupled p-type MOS (PMOS). Together, the inverters 370, 375 and MOS logic 365, 378 act as a delay element. For another embodiment, active capacitors 365, 378 may be substituted by passive capacitors, or omitted entirely. For another embodiment, resistors may be substituted for inverters 370, 375, to form a standard R-C delay. For yet another embodiment, a clock/counter delay element, as known in the art, may be substituted for the inverters 370, 375 and active capacitors 365, 378.

The output of the last inverter 375 is coupled to latch 380. For one embodiment, the latch 380 is an SR latch, and the output of the last inverter 375 is coupled as the S-input to latch 380. The R-input to latch 380 is the CMOS output signal 345.

Figure 8:
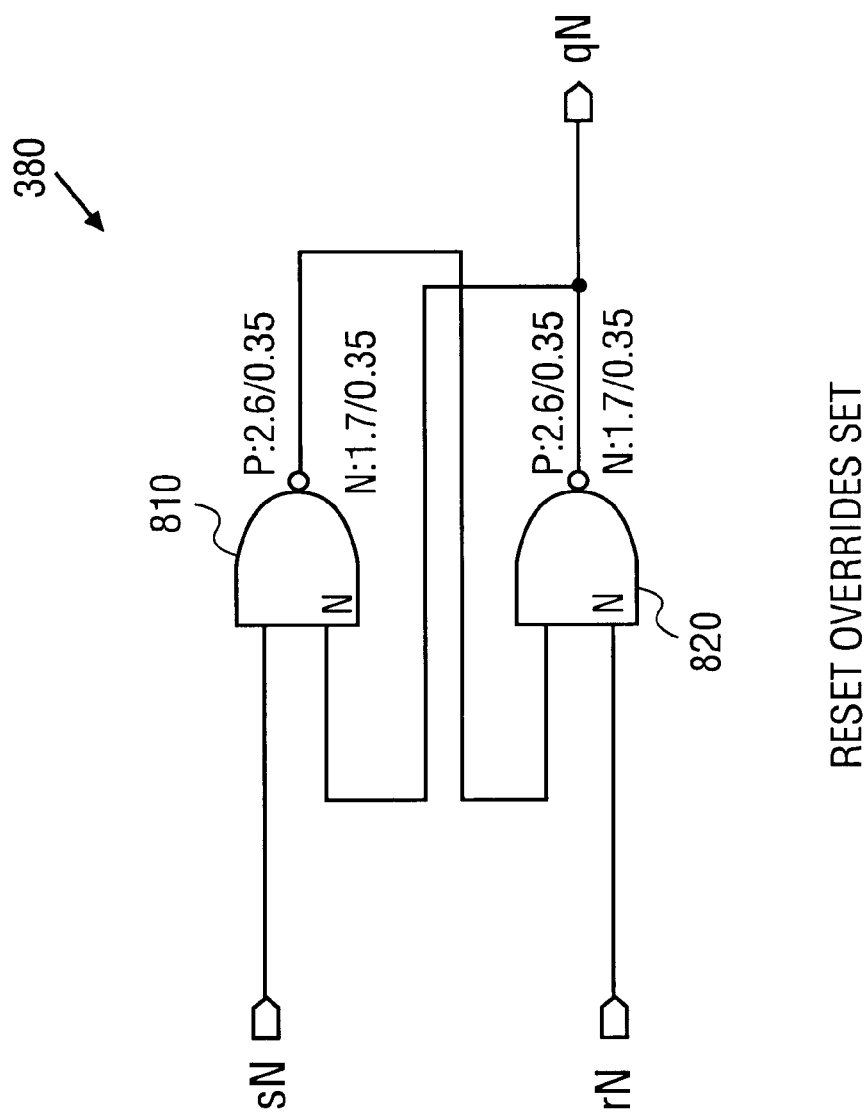
FIG. 8 is a circuit diagram of one embodiment of the SR-latch.

FIG. 8 is a circuit diagram of one embodiment of the SR-latch. The SR latch 380 includes two cross-coupled NAND gates. The inputs to the first NAND gate 810 are the Set input and a feedback signal from the output of the second NAND gate 820. The inputs to the second NAND gate 820 are the Reset input and the output of the first NAND gate 810. The output of the second NAND gate 820 is the output of the SR latch 380.

Thus, if the set signal S, the output of inverter 375, is asserted, the output of the SR latch 380 will be asserted, while if the reset signal R, the CMS output signal 345, is asserted, the output of the SR latch 380 will be deasserted. When both S and R are deasserted, the last stored values of the output will continue to be stored in the cross-coupled structure. Note that Reset overrides Set in the SR latch 380.

The output of the latch 380 is the power-on reset signal, while the inverse of the power-on reset signal is output 390. The output 390 may be coupled to various circuits to provide a power-on-reset signal.

Figure 4:
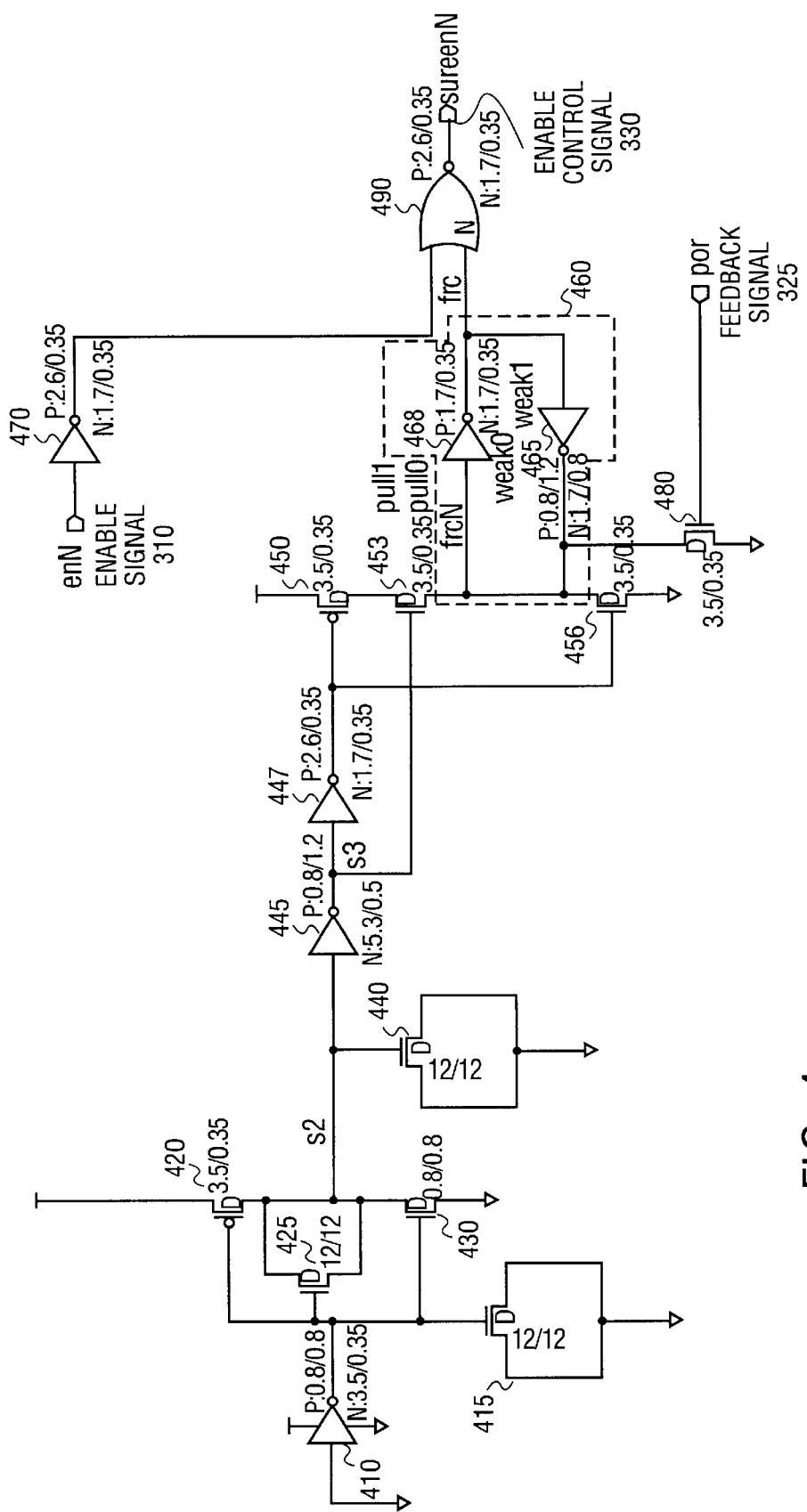
FIG. 4 is a circuit diagram of one embodiment of the enable circuit.

FIG. 4 is a circuit diagram of one embodiment of the enable circuit. An input of complementary metal oxide semiconductor (CMOS) inverter 410 is coupled to ground. The output of CMOS inverter 410 is coupled to the gates of o-type MOS (PMOS) 420, n-type MOS (NMOS) 425, NMOS 430, and NMOS 415. NMOS 415 is has its drain and source coupled to ground, and thus acts as an active capacitor.

An output coupled between PMOS 420 and NMOS 430 is coupled to the gate of active capacitor 440, and as an input to inverter series 445, 447. Inverter series 445, 447 act as a delay.

The output of inverter 447 is input to the gates of PMOS 450, which is coupled to Vcc, and NMOS 456, which is coupled to ground. PMOS 450, NMOS 453, which has its gate coupled to the output of inverter 445, and NMOS 456 are coupled in series between Vcc and ground.

An memory cell 460 consisting of inverters 463 and 465 are coupled between NMOS 453 and NMOS 456. The memory cell 460 acts as a static memory cell. The output of the memory cell 460 is coupled to a first input of a NOR gate 490. The other input to NOR gate 490 is an enable signal. The enable signal is the active low enable signal 310, passed through inverter 470. The output of NOR 490 is the enable control signal 330, discussed above.

NMOS 480 is coupled between ground and memory cell 460. The gate of NMOS 480 is coupled to the feedback signal 325, which is the power-on reset signal output by the power-on reset system 200. Thus, when the power-on reset system emits a signal, the NMOS 480 is turned on, and the memory cell 460 is discharged to ground. In this way, the enable control signal 330 is held high until the POR has signaled.

Figure 5:
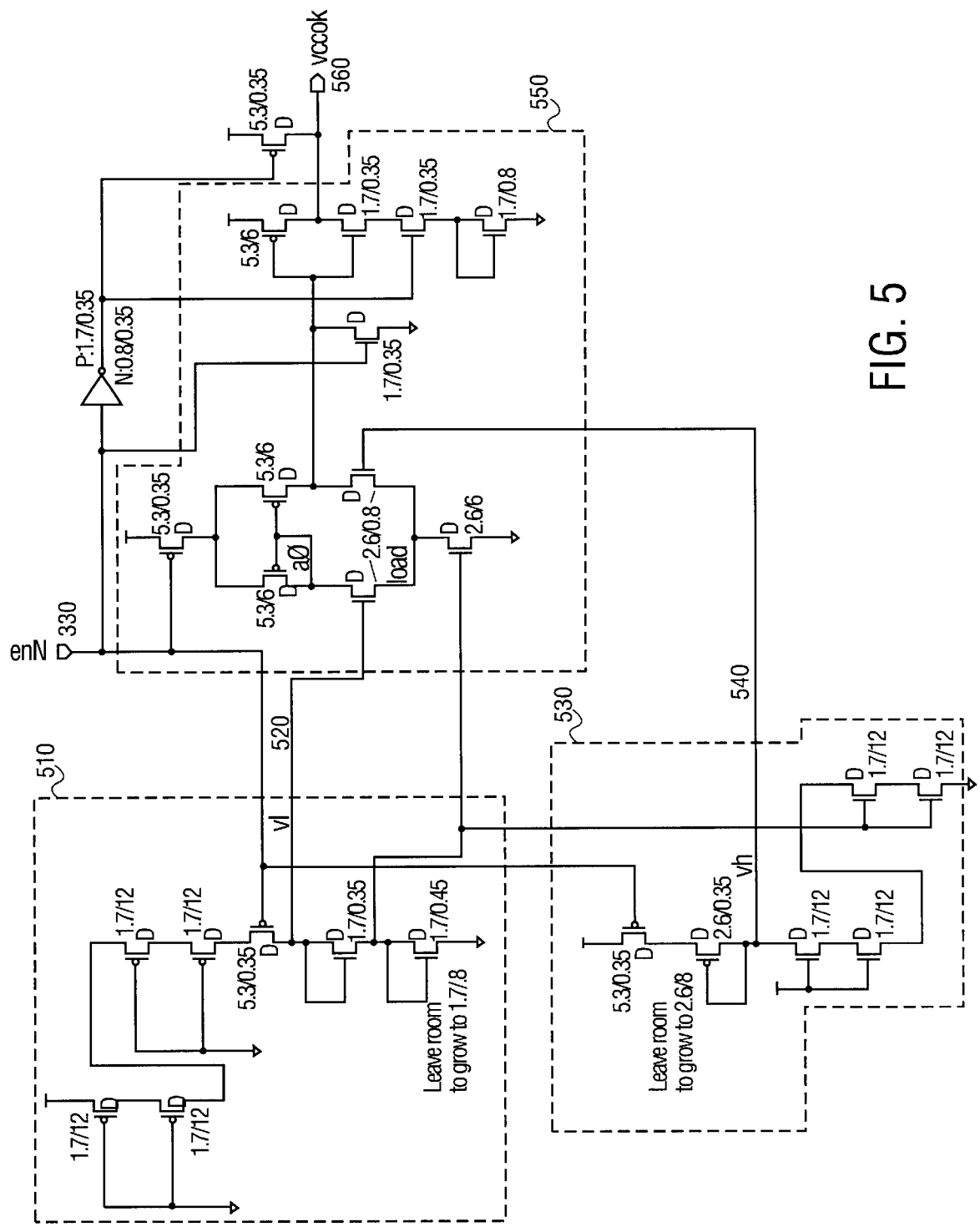
FIG. 5 is a circuit diagram of one embodiment of the CMOS logic.

FIG. 5 is a circuit diagram of one embodiment of the CMOS logic. The CMOS logic 340 tests whether the voltage level is sufficiently high to drive a number of CMOS gates. For one embodiment, the actual configuration of the CMOS logic 340 may be varied, as long as a large number of CMOS gates are driven by the Vcc. The output of the CMOS logic 340 indicates whether the CMOS gates are properly driven by the Vcc.

Low voltage block 510 generates signal $V_L$ 520. Signal $V_L$ 520 is a low voltage signal, for one embodiment, signal $V_L$ 520 is 2 $V_{TN}$ above ground.

High voltage block 530 generates signal $V_H$ 540. Signal $V_H$ 540 is a high voltage signal. For one embodiment, signal $V_H$ 540 is 1 $V_{TP}$ below $V_{DD}$, the voltage supply voltage.

Comparator 550 compares the $V_H$ 540 and $V_L$ 520 signals. If $V_H > V_L$, then the output of comparator, VCCOK 560, is high to indicate that the voltage level is high enough to drive CMOS logics.

Enable signal 330 turns off both high voltage block 520 and low voltage block 510. High voltage block 520 and low voltage block 510 consume static power. Thus, by the enable signal 330 disconnecting the high and low voltage blocks 510, 520, the power consumption of the CMOS logic 340 is reduced, for one embodiment to zero.

Figure 6:
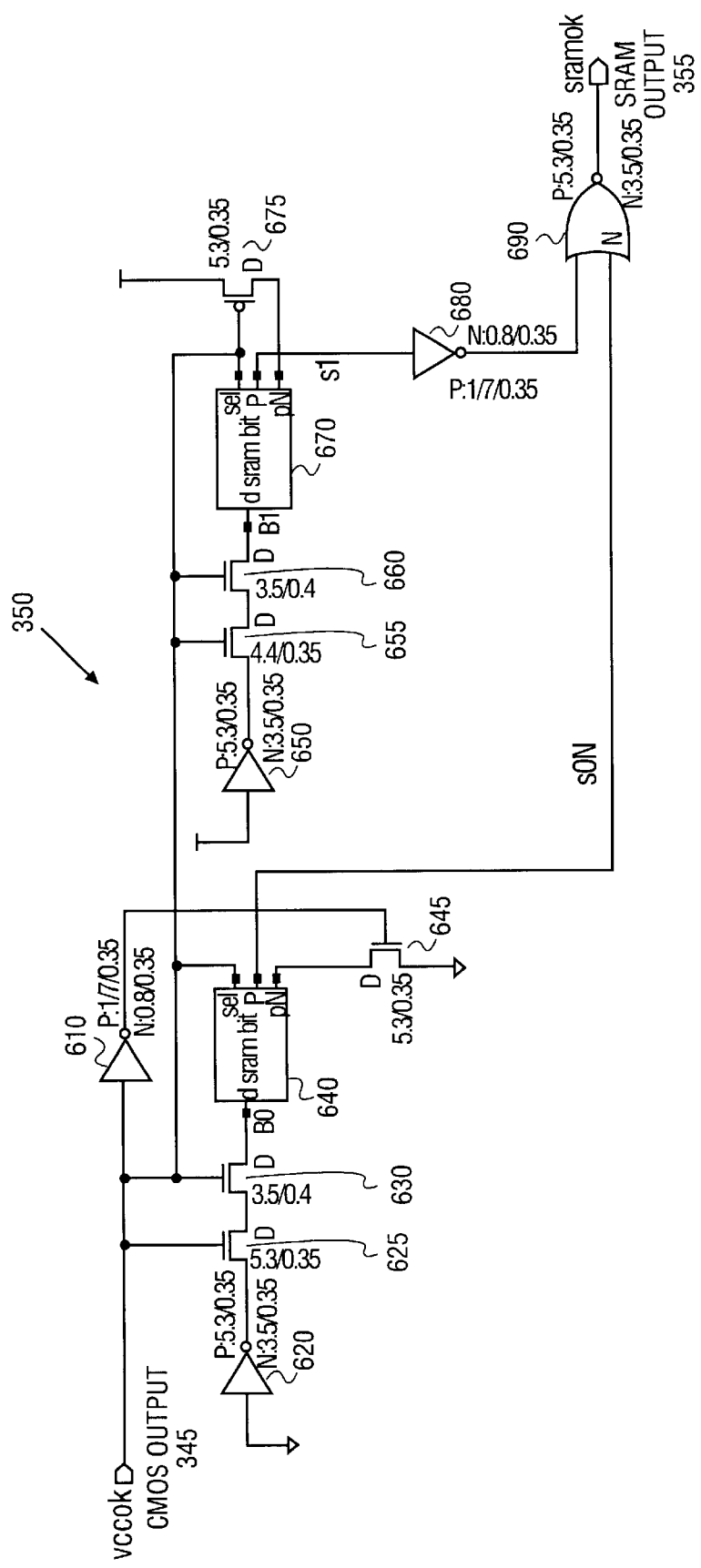
FIG. 6 is a circuit diagram of one embodiment of the SRAM logic.

FIG. 6 is a circuit diagram of one embodiment of the SRAM logic. CMOS output signal 345 is an input to the SRAM logic 350. The CMOS output signal 345 is an input to inverter 610, and is a gate input to two NMOS 625, 630 coupled in series. An inverter 620 coupled to ground provides the source input to NMOS 625. The output of NMOS 630 is coupled as the data input to memory cell 640.

Figure 7:
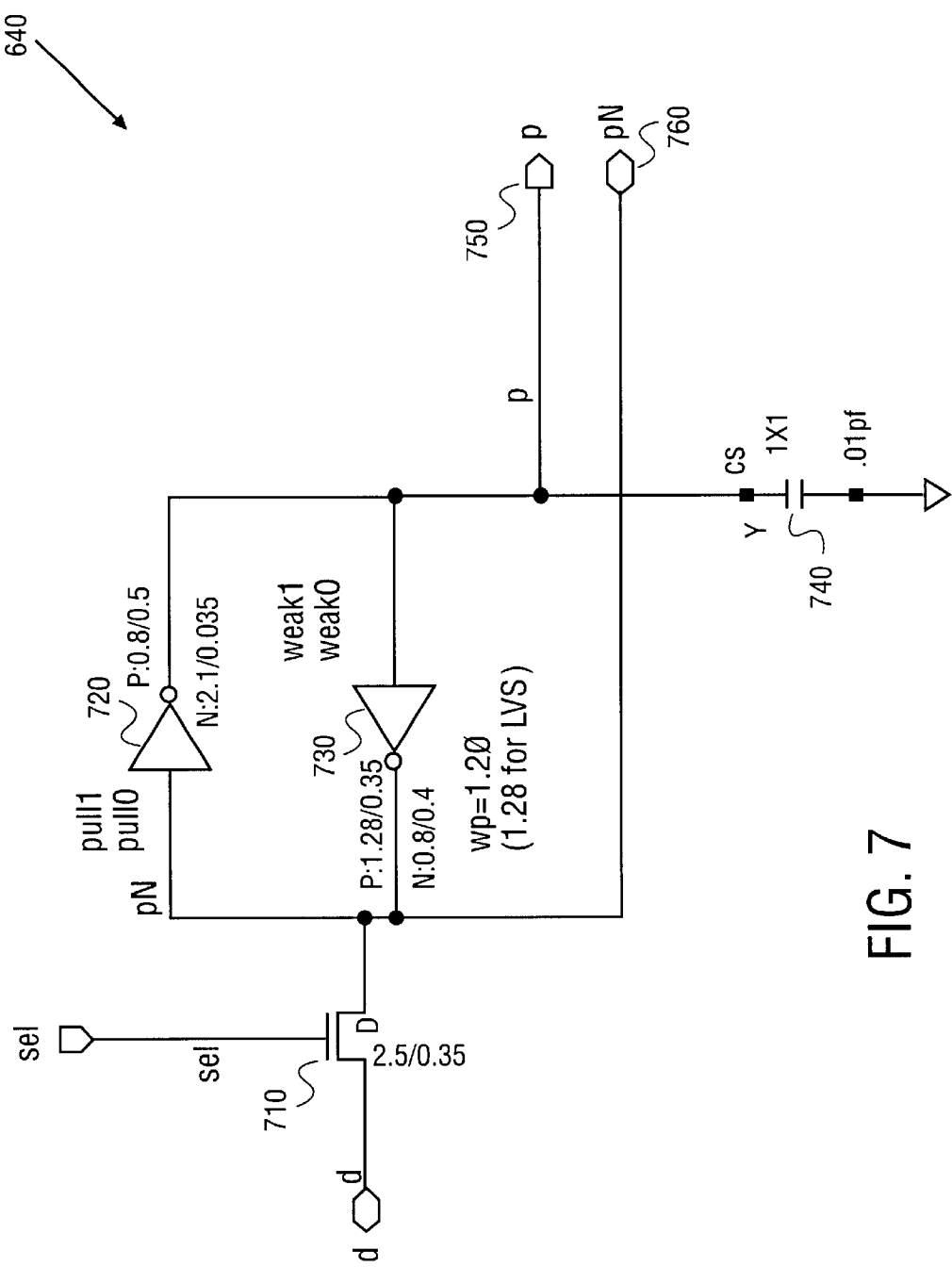
FIG. 7 is a circuit diagram of one embodiment of the configuration SRAM bit.

FIG. 7 is a circuit diagram of one embodiment of the configuration SRAM bit. The SRAM bit 640 for one embodiment is identical to the SRAM bit 670 (not shown). The SRAM bit 640 has as inputs a data signal, the drain of NMOS 630, and a select signal, the feedback signal from the output of SRAM 670. NMOS 710 receives as its gate input the select signal, and as its source the data signal. The drain of NMOS 710 is coupled into the SRAM body. The SRAM body consists of two inverters 720, 730 coupled in a circle. Thus, the input to the first inverter 720 is the data signal, if the select signal is asserted (high). The input to the second inverter 730 is the output of the first inverter 720. In this way, the data inserted into the SRAM body circles around indefinitely. Also coupled the SRAM body is capacitor 740. The output 750 of the SRAM 640 is the output of the first inverter 720, while the inverted output 760 is the output of the second inverter 730. Capacitor 740 couples the inverters 720, 730 to ground.

Returning to FIG. 6, when CMOS output 345 is asserted, i.e. high, the 1, the output of inverter 620, is written into the memory cell 640. The Select input of the memory cell 640 is also coupled to CMOS output 345. The inverted output of memory cell 640, qN, is coupled to ground via NMOS 645. The gate of NMOS 645 is coupled to the output of inverter 610, and thus receives the inverted CMOS output signal 345.

Thus, when the CMOS output signal 345 becomes asserted, high, a 1 is written to memory cell 640. This is coupled as a first input to NOR 690.

Similarly, NMOS 655 and 660 are coupled in series, with the source of NMOS 655 coupled to Vcc through inverter 650. The drain of NMOS 660 is coupled as the data input to second memory cell 670. The CMOS output signal 345 is the gate input to NMOS 655, 660. Thus, when CMOS output signal 345 is asserted, high, NMOS 655, 660 couple the output of inverter 650, the inverted Vcc signal, to the data input of memory cell 670. Thus, when CMOS output signal 345 is asserted, a zero is written into the memory cell 670. The select of memory cell 670 is coupled to CMOS output 345. The output of memory cell 670 is coupled, through inverter 680, as the second input to NOR gate 690.

The output of NOR gate 690 is SRAM output 355. The output of a NOR gate 690 is a one, or asserted, only if both inputs to the NOR gate are zeroes. Thus, the output of first memory cell 640 has to be a zero, and the output of memory cell 670 has to be a one. Both memory cells 640, 670 are forced to an opposite value, memory cell 640 to a one, and memory cell 670 to a zero when CMOS output 345 is not being asserted. Thus, if both writing operations are successful, the output of NOR gate 690 is a 1, and SRAM output signal 355 is asserted.

Figure 9:
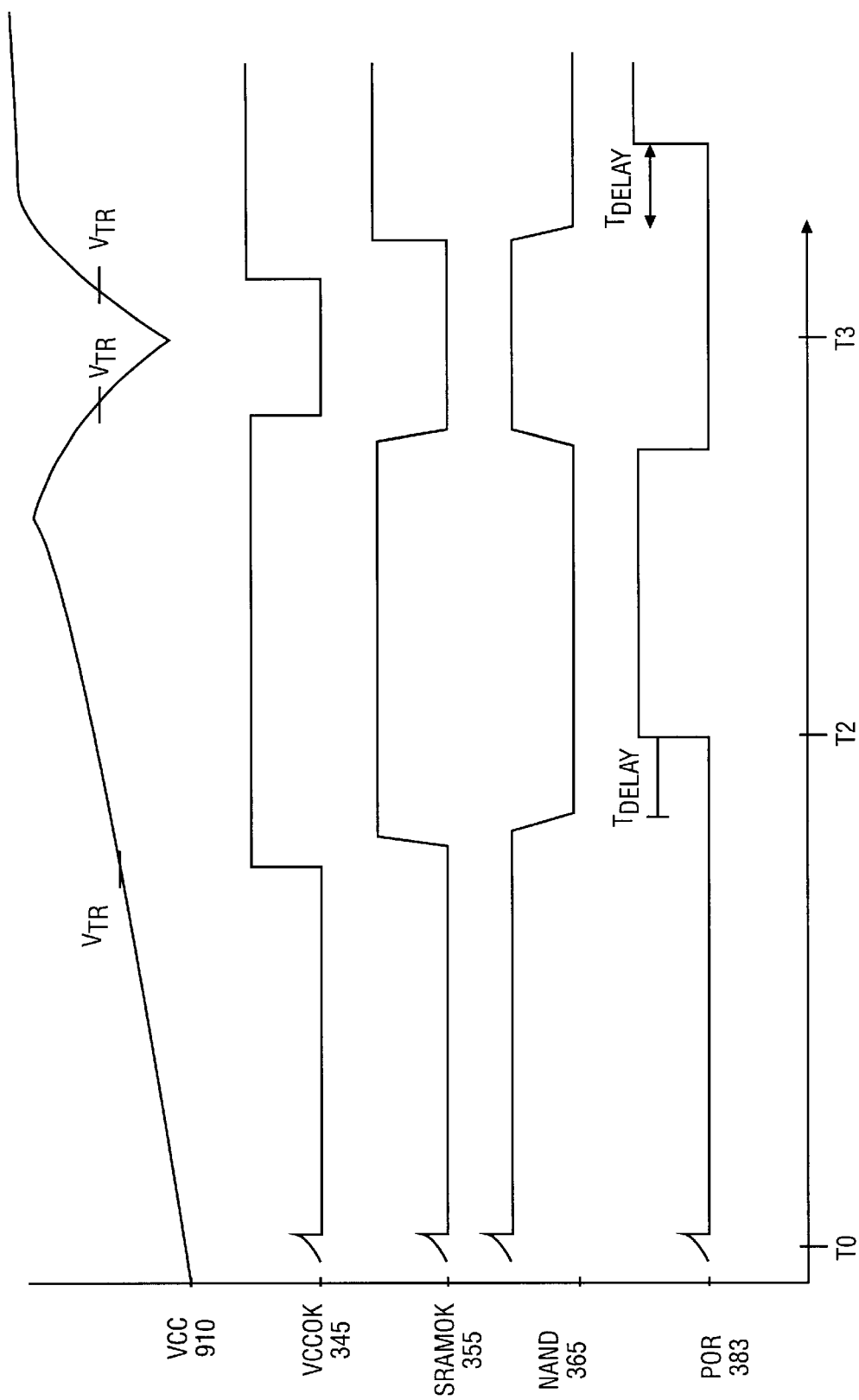
FIG. 9 is a waveform diagram of an example of the relationship of a reference voltage and the power-on reset signal.

FIG. 9 is a waveform diagram of an example of the relationship of a reference voltage and the power-on reset signal. FIG. 9 is not to scale, but illustrates the relationship between various signals.

Signal Vcc 910 is the power supply. The power supply is turned on at time T0, and approaches the preset level. For one embodiment, Vcc preset level may be 3.3 volts, 5 volts, 12 volts, or any other level, as defined by the circuitry. Vcc further has a threshold voltage level, Vtr. The level of Vtr depends on the circuitry coupled to the voltage supply Vcc. The threshold voltage Vtr is the lowest voltage at which the circuitry coupled to the Vcc can operate successfully. The power-on reset system 200 described above, operates to determine this threshold voltage, and to determine whether Vcc is above the threshold voltage.

The VccOK signal 345 is the output of the CMOS logic 340. The VccOK signal 345 indicates that the level of Vcc is above the threshold, Vtr, and is sufficient to operate CMOS logic.

The SRAMOK signal 355 is the output of the SRAM logic 350. The SRAMOK signal 355 indicates that the level of Vcc is above the level needed to write to and rewrite SRAM logic. Generally, the level used for CMOS logic and he level to read/write SRAM logic are relatively close. Therefore, VccOK 345 and SRAMOK 355 generally are asserted at almost the same time.

The NAND signal 365 is the output of the NANDed VccOK signal 345 and SRAMOK signal 355. Thus, when both the VccOK 345 and SRAMOK 355 are asserted, or low, the NAND signal 365 is asserted, or high.

A tdelay after the NAND signal 365 is asserted, the power-on reset (POR) signal 383 is asserted. The tdelay is introduced by a delay element in the power-on reset system 200. When the POR signal 383 is asserted, the circuits coupled to the power-on reset system 200 can be assured that Vcc is sufficiently high to run all of the circuitry.

FIG. 9 further illustrates a short, sudden drop in Vcc, centered around time T3. Vcc declines until it reaches a first threshold voltage level, when the SRAM can no longer rewrite with the Vcc level. At that point, SRAMOK 355 goes low. Because SRAMOK 355 goes low, NAND output 365 immediately goes low, as does the POR signal 383. VccOK 345 does not receive a feedback from any of these signals, and goes low a short period of time later, when Vcc drops below the level that CMOS can operate. As can be seen, when Vcc drops below a level, POR signal 383 is forced low, without a delay. In this way, POR signal 383 makes certain that both VccOK and SRAMOK are asserted, and provides a delay for turning on the POR signal 383, while the POR signal 383 is immediately forced low when either VccOK or SRAMOK are deasserted. This guarantees a that POR signal 383 indicates a stable and sufficiently high Vcc for all circuits that are coupled to the power-on reset system 200.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A power-on reset system to inhibit operation of a device until a voltage level of a supply voltage meets conditions, the power-on reset system comprising:
    a voltage sense circuit receiving the supply voltage to determine whether the voltage level is above a threshold;
    a write/rewrite verifier circuit including a first memory cell and coupled to the voltage sense circuit, the write/rewrite verifier circuit to determine whether the voltage level is high enough to write to and rewrite a memory cell content of the first memory cell;
    wherein the write/rewrite verifier circuit outputs a power-on reset pulse when the voltage level is above the threshold and high enough to write to and rewrite the memory cell content, thereby indicating that the voltage level meets the conditions.

2. The power-on reset system of claim 1, further comprising a delay circuit to delay the power-on reset pulse after the voltage level meets the conditions.

3. The power-on reset system of claim 1, further comprising an enable circuit outputting a POR enable signal to turn off the voltage sense circuit and write/rewrite verifier circuit, the enable circuit asserted during device power-up, and remaining asserted during the power-on reset pulse.

4. The power-on reset system of claim 3, wherein the enable circuit comprises:
    a second memory cell;
    a first logic for generating a pulse to write a first value to the second memory cell; and
    a NOR gate receiving as a first input an outside enable signal, and receiving as a second input an output of the memory cell, the output of the NOR gate coupled as the POR enable signal;
    wherein the power-on reset pulse signal is coupled through a switch to the second memory cell, such that when the power-on reset pulse signal is complete, the second memory cell contains a second value, such that the POR enable signal is allowed to be turned off after the power-on reset signal is completed.

5. The power-on reset system of claim 4, wherein the pulse is generated when the circuit is initially turned on, forcing the second memory cell to a predetermined first value.

6. The power-on reset system of claim 1, wherein the write/rewrite verify circuit comprises:
    the first memory cell initialized to a first state;
    a second memory cell initialized to a second state;
    a writing logic to write the first memory cell to the second state and to write the second memory cell to the first state;
    such that an output of the write/rewrite verify circuit indicates whether the writing logic was successful in writing to the first and the second memory cell.

7. The power-on reset system of claim 6, wherein an input to the write/rewrite is an output of the voltage sense circuit, and the writing logic writes to the first and second memory cells when the output of the voltage sense circuit indicates that the voltage level is above the threshold.

8. The power-on reset system of claim 1, wherein the voltage sense circuit determines whether the voltage level is high enough to operate the device.

9. The power-on reset system of claim 8, wherein the voltage sense circuit asserts the power-on reset pulse, when the voltage level subsequently drops below the threshold.

10. The power-on reset system of claim 1, wherein the write/rewrite verify circuit determines whether the voltage level is high enough to write to the first memory cell.

11. A power-on reset system to inhibit operation of a device until a voltage level of a supply voltage meets conditions, the power-on reset system comprising:
    a sensing circuit coupled to receive the supply voltage to determine whether the voltage level is above a threshold;
    a write/rewrite verify circuit coupled to the sensing circuit to sense whether the voltage level is high enough to write to and rewrite memory cells;
    a delay logic coupled to the write/rewrite verify circuit to delay a power-on reset signal from the sensing circuit after the sensing circuit determines that the voltage level is above the threshold, the delay logic and the sensing circuit together forming a power-on reset logic; and
    an enable circuit to completely turn off the power-on reset logic, the enable circuit asserted during power-up of the device, and remaining asserted during the power-on reset signal.

12. The power-on reset system of claim 11, wherein the enable circuit comprises:
    a first memory cell;
    a first logic for generating a pulse to write a first value to the first memory cell; and
    a NOR gate receiving as a first input an outside enable signal, and receiving as a second input an output of first memory cell, the output of the NOR gate coupled as the POR enable signal;
    wherein the power-on reset pulse signal is coupled through a switch to first memory cell, such that when the power-on reset signal is complete, first memory cell contains a second value, such that the POR enable signal is turned off when the power-on reset signal is completed.

13. The power-on reset system of claim 12, wherein the power-on reset signal is generated when the system is initially turned on, forcing the first memory cell to a predetermined first value.

14. The power-on reset system of claim 11, wherein
    the sensing circuit is further to sense whether the voltage level is high enough to enable the device, wherein the device includes CMOS logic.

15. The power-on reset system of claim 14, wherein the voltage sense circuit comprises:
    a low voltage block for determining whether the voltage level is a set level above a first value; and
    a high voltage block for determining whether the voltage level is a set level below a second value.

16. The power-on reset system of claim 15, wherein the high voltage block outputs a high voltage signal, and the low voltage block outputs a low voltage signal, and wherein the voltage sense circuit further comprises a comparator to determine whether the high voltage signal is greater than the low voltage signal, and to output a signal indicating that the voltage level is high enough to drive the CMOS logic when the high voltage signal is greater than the low voltage signal.

17. The power-on reset system of claim 14, wherein the write/rewrite verify circuit comprises:
   a first memory cell initialized to a first state;
   a second memory cell initialized to a second state;
   a writing logic for writing the first memory cell to the second state and writing the second memory cell to the first state;
   such that an output of the write/rewrite verify circuit indicates whether the writing logic was successful in writing to the first and the second memory cell.

18. The power-on reset system of claim 17, wherein an input to the write/rewrite is an output of the voltage sense circuit, and the writing logic writes to the first and second memory cells when the output of the voltage sense circuit indicates that the voltage level is above the threshold.

19. A power-on reset system for outputting a power-on reset signal when a voltage level of an external enable signal is above threshold, he power-on reset system comprising:
   an enable circuit receiving the external enable signal, the enable circuit having as a feedback signal the power-on reset signal, the enable circuit outputting a non-external enable signal;
   a CMOS logic receiving as an input the non-external enable signal, the CMOS logic for determining whether the voltage level is high enough to drive the CMOS logic;
   an SRAM logic having an SRAM cell receiving as an input an output of the CMOS logic, the SRAM logic for determining whether the voltage level is high enough to write to and rewrite the SRAM cell;
   a NAND gate receiving as inputs the output of the CMOS logic and an output of the SRAM logic;
   a delay logic having as an input an output of the NAND gate, the delay logic outputting a delayed signal;
   a Set Reset (S-R) latch having as a set input the delay signal, and having as a reset input the output of the CMOS logic;
   an output of the S-R latch being the power-on reset signal.

20. A power-on reset system for outputting a power-on reset signal when a voltage level of a supply voltage is above a threshold, the power-on reset system comprising:
   a first means receiving the supply voltage for determining whether the voltage level is high enough to drive the first means;
   a second means coupled to the first means and having an SRAM cell for determining whether the voltage level is high enough to write to and rewrite the SRAM cell;
   a third means coupled to the second means for turning on the power-on reset signal when the voltage level is high enough to drive the first means and high enough to write to and rewrite the SRAM cell; and
   a means coupled to the first to third means for disabling the system to reduce power consumption.

* * * * *